US011349024B2

(12) United States Patent
Huang et al.

(10) Patent No.: US 11,349,024 B2
(45) Date of Patent: May 31, 2022

(54) SEMICONDUCTOR DEVICE

(71) Applicant: Realtek Semiconductor Corporation, Hsinchu (TW)

(72) Inventors: Chung-Yu Huang, Hsinchu (TW); Po-Ching Lin, Hsinchu (TW); Tay-Her Tsaur, Hsinchu (TW)

(73) Assignee: REALTEK SEMICONDUCTOR CORPORATION, Hsinchu (TW)

( * ) Notice: Subject to any disclaimer, the term of this patent is extended or adjusted under 35 U.S.C. 154(b) by 136 days.

(21) Appl. No.: 16/925,519

(22) Filed: Jul. 10, 2020

(65) Prior Publication Data
US 2021/0126127 A1 Apr. 29, 2021

(30) Foreign Application Priority Data
Oct. 28, 2019 (TW) .................. 108138902

(51) Int. Cl.
*H01L 29/78* (2006.01)
*H01L 29/06* (2006.01)
*H01L 29/40* (2006.01)
(52) U.S. Cl.
CPC ...... *H01L 29/7816* (2013.01); *H01L 29/0653* (2013.01); *H01L 29/402* (2013.01)

(58) Field of Classification Search
CPC ..... H01L 29/06; H01L 29/0653; H01L 29/40; H01L 29/402; H01L 29/78; H01L 29/7802; H01L 29/7816
USPC ......................................... 257/339
See application file for complete search history.

(56) References Cited

U.S. PATENT DOCUMENTS

2016/0111488 A1* 4/2016 Lu .............. H01L 29/0653
257/330
2018/0308841 A1* 10/2018 Liu ................ H01L 27/0886

FOREIGN PATENT DOCUMENTS

CN 110024134 * 7/2019 ......... H01L 29/0653
TW 201714271 A 4/2017

* cited by examiner

*Primary Examiner* — Fazli Erdem
(74) *Attorney, Agent, or Firm* — Locke Lord LLP; Tim Tingkang Xia, Esq.

(57) ABSTRACT

A semiconductor device includes an active area structure, at least one gate and at least one isolation structure. The active area structure is arranged along a first direction. The at least one gate is arranged above the active area structure and along a second direction. The second direction is different from the first direction. The at least one isolation structure is arranged in the active area structure. A length of the at least one isolation structure is shorter than a width of the active area structure in the second direction.

20 Claims, 13 Drawing Sheets

A1-A1'

SEMICONDUCTOR DEVICE

RELATED APPLICATIONS

This application claims priority to Taiwan Application Serial Number 108138902, filed Oct. 28, 2019, which is herein incorporated by reference in its entirety.

BACKGROUND

Technical Field

The disclosure relates to a semiconductor device, particularly to a laterally diffused metal oxide semiconductor (LDMOS) device.

Description of Related Art

As the process evolves, in the integrated application of power chips, conventional metal-oxide-semiconductor field-effect semiconductor architectures have insufficient voltage resistance and are no longer applicable. The laterally diffused metal oxide semiconductor (LDMOS) is widely used for semiconductor integrated circuits due to its high power and high voltage characteristics.

However, the laterally diffused metal oxide semiconductor has a low on-current and a large resistance, and usually requires more area to be compensated. Therefore, under the condition that the size is limited, how to design a laterally diffused metal oxide semiconductor is a very important issue.

SUMMARY

One aspect of the present disclosure is a semiconductor device. The semiconductor device includes an active area structure, at least one gate and at least one isolation structure. The active area structure is arranged along a first direction. The at least one gate is arranged above the active area structure and along a second direction. The second direction is different from the first direction. The at least one isolation structure is arranged in the active area structure. A length of the at least one isolation structure is shorter than a width of the active area structure in the second direction.

Another aspect of the present disclosure is a semiconductor device. The semiconductor device includes an active area structure, at least one gate, at least one first metal structure, at least one second metal structure and at least one polysilicon structure. The active area structure is arranged along a first direction. The at least one gate is arranged above the active area structure and along a second direction different from the first direction. The at least one first metal structure is arranged above the active area structure as a source of a transistor. The at least one second metal structure is arranged above the active area structure as a drain of the transistor. The at least one polysilicon structure is arranged above the active area structure. The active area structure includes a first area covered by silicide and at least one second area not covered by silicide. The at least one second area and the at least one polysilicon structure are connected to each other and cross two sides of the active area structure parallel to the first direction.

DETAILED DESCRIPTION

Figure 1:
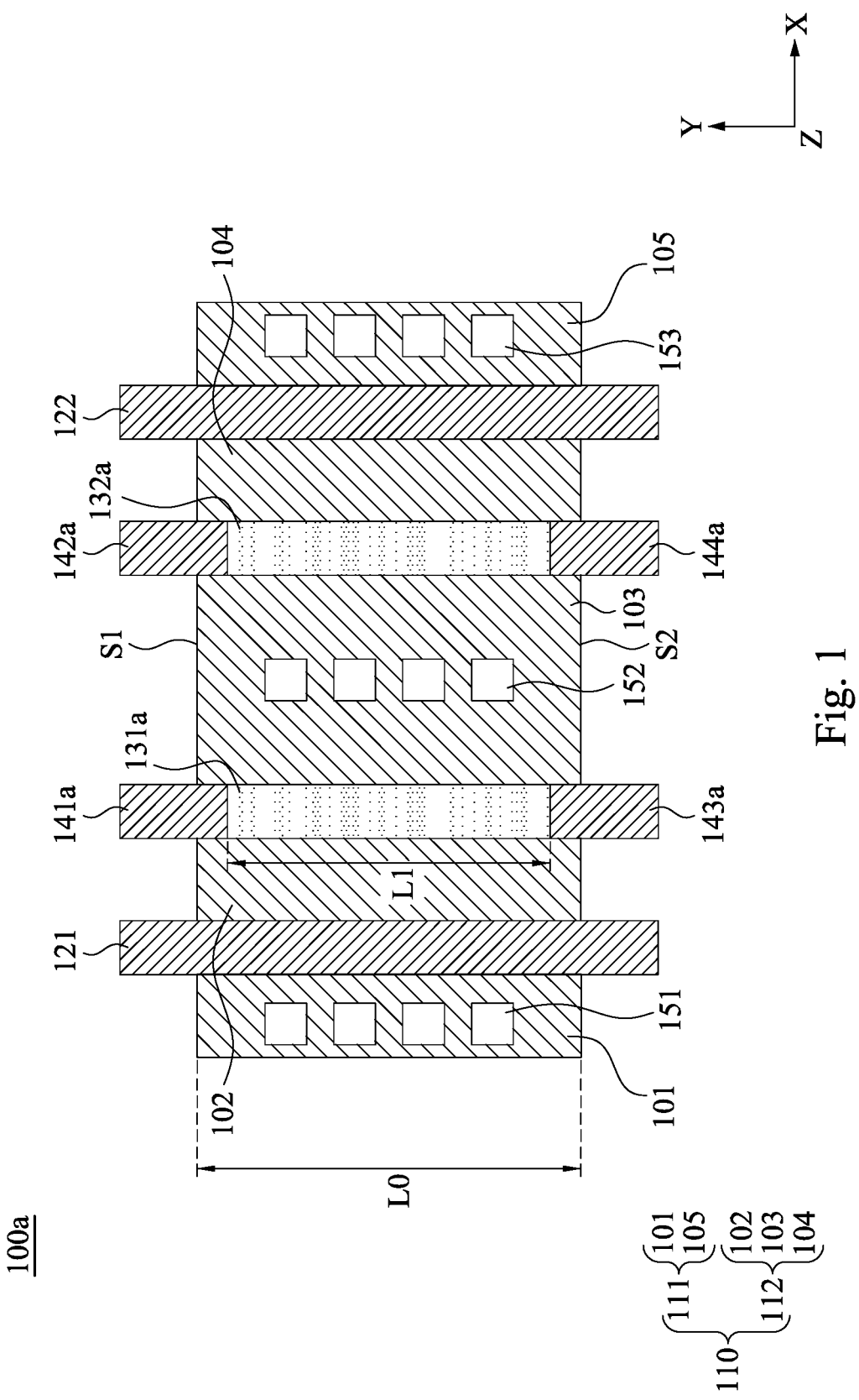
FIG. 1 is a schematic diagram illustrating a semiconductor device in accordance with some embodiments of the disclosure.

The following disclosure provides many different embodiments or examples for implementing different features of the provided subject matter. Specific examples of components and arrangements are described below to simplify the present disclosure. However, these are merely examples and are not intended to be limiting. For example, formation of the first feature above or on the second feature in the subsequent description may include embodiments where the first and second features are formed in direct contact, and may also include embodiments where additional features are formed between the first and second features so that the first and second features may not be in direct contact. In addition, the disclosure may reuse element symbols and/or letters in the examples. Reuse is for simplicity and clarity, and element symbols and/or letters themselves do not indicate a relationship between the various embodiments and/or structures discussed.

In addition, spatially relative terms such as "below", "under", "lower", "above", "on", "upper", etc. may be used herein for ease of description of the relationship of one element or feature to another element or feature as illustrated in the drawings is described. In addition to the orientation depicted in the drawings, spatially relative terms are intended to encompass different orientations of the device in use or operation. The device may be otherwise oriented (rotated 90 degrees or in other directions) and the spatially relative descriptors used herein may therefore be interpreted as such.

Please refer to FIG. 1. FIG. 1 is a schematic diagram illustrating a semiconductor device in accordance with some embodiments of the disclosure. As shown in FIG. 1, the semiconductor device 100 includes an active area structure 110, gates 121, 122, and metal structures 151, 152 and 153. The gates 121, 122 and metal structures 151, 152 and 153 are arranged above the active area structure 110. The gate 121 is located between the metal structures 151 and 152, and the gate 122 is located between the metal structures 152 and 153. In some embodiments, metal structures 151 and 153 are as a source of a transistor, and the metal structure 152 is as a drain of the transistor. In the present disclosure, the connection direction between the source and the drain of the transistor is defined as a first direction. In other words, the first direction is the direction of on-current of the transistor.

In some embodiments, as shown in FIG. 1, the first direction is X-direction, and the active area structure 110 is arranged along the first direction. The gates 121 and 122 are along a second direction, which is different from the first direction. In some embodiments, the second direction and the first direction are perpendicular to each other, such as X-direction and Y-direction are perpendicular to each other, but it is not limited the present disclosure.

Specifically, the active area structure 110 includes a first active area 111 of a first type, a second active area 112 of a second type. The gates 121 and 122 are arranged above the junction between the first active area 111 and the second active area 112, and along from one side S1 of the active area structure 110 to another side S2 of the active area structure 110 of which the two sides are parallel to the first direction.

For example, as shown in FIG. 1, the first active area 111 of the first type includes areas 101 and 105. The second active area 112 of the second type includes areas 102, 103 and 104. The area 101 of the first active area 111 is arranged at the left side of the gate 121. The areas 102, 103 and 104 of the second active area 112 are arranged between the right side of the gate 121 and the left side of the gate 122. The area 105 of the first active area 111 is arranged at the right side of the gate 122. In addition, the metal structure 151 is arranged above of the area 101, the metal structure 152 is arranged above the area 103, and the metal structure 153 is arranged above the area 105.

In some embodiments, the first type is P-typed and the second type is N-typed. However, the present disclosure is not limited to the types described above. Other suitable types to configure the first type and second type are also within the scope of this disclosure. Furthermore, in some embodiments, the gates are made of polysilicon material.

In some embodiments, the semiconductor device 100 further includes shallow trench isolation (STI) structures 131a and 132a. As shown in FIG. 1, the isolation structures 131a and 132a are arranged in the active area structure 110. The isolation structure 131a is arranged between the gate 121 and the metal structure 152, and the isolation structure 132a is arranged between the gate 122 and the metal structure 152. Specifically, the length L1 of the isolation structures 131a and 132a in the second direction is shorter than the width L0 of the active area structure 110 in the second direction.

In this way, by arranging the isolation structures 131a and 132a, the withstand voltage of the semiconductor device 100a can be improved, and in the second direction, the length of the isolation structure 131a and 132a is smaller than the width of the active area structure 110, so in the first direction, the on-current between the source and drain will not be completely blocked, and part of the current can pass through the portions without the isolation structure, so that the overall on-current can be increased.

In some embodiments, semiconductor device 100 further includes polysilicon structures 141a~144a. As shown in FIG. 1, the polysilicon structures 141a~144a are arranged above the active area structure 110. The polysilicon structures 141a and 143a and the isolation structure 131a are connected to each other, arranged between the gate 121 and the metal structure 152, and along from one side S1 of the active area structure 110 to another side S2 of the active area structure 110 of which the two sides are parallel to the first direction. Similarly, the polysilicon structures 142a, 144a and the isolation structure 132a are connected to each other, arranged between the gate 122 and the metal structure 152, and along from one side S1 of the active area structure 110 to another side S2 of the active area structure 110 of which the two sides are parallel to the first direction. Specifically, the polysilicon structure 141a is connected between the isolation structure 131a and one side S1 of the active area structure 110. The polysilicon structure 143a is connected between the isolation structure 131a and another side S2 of the active area structure 110.

In this way, the polysilicon structure 141a, 143a and the isolation structure 131a are along the second direction to separate the surface of the active area structure 110 into the areas 102 and 103, and the polysilicon structure 142a, 144a and the isolation structure 132a are along the second direction to separate the surface of the active area structure 110 into the areas 103 and 104. In other words, between the left side of the isolation structure 131a and the right side of the gate 121 is the area 102. Between the right side of isolation structure 131a and the left side of the isolation structure 132a is the area 103. Between the right side of the isolation structure 132a and the left side of the gate 122 is the area 104.

Since the area forming the isolation structure or the polysilicon structure has no silicide, therefore, when the on-current is concentrated to the portions where there is no isolation structure 131a or 132a (i.e., portions under the polysilicon structures 141a~144a), the on-current will not be attracted by the surface with the silicide which is better conductive. In other words, by the isolation structures and polysilicon structures connected to each other in the second direction and crossing both sides S1 and S2 of the active area structure 110, the structure can be prevented from being damaged by the excessively concentrated current attracted by the silicide.

It should be noted that, the isolation structures 131a, 132a and polysilicon structures 141a~144a illustrated in FIG. 1 are merely examples, not intended to limit the present disclosure. The shape, size, position, and number of the isolation structures and polysilicon structures included in the semiconductor device 100 may be adjusted and designed according to actual needs, which will be described in the following paragraphs. For the sake of brevity in description, similar elements in the following embodiments as those in the embodiment of FIG. 1 are represented by the same element symbols, and the contents have been described in the previous paragraph and will not be described again. In addition, when the following embodiment is a left-right symmetrical structure, only one side will be described, and the other side structure will not be described again.

Figure 2:
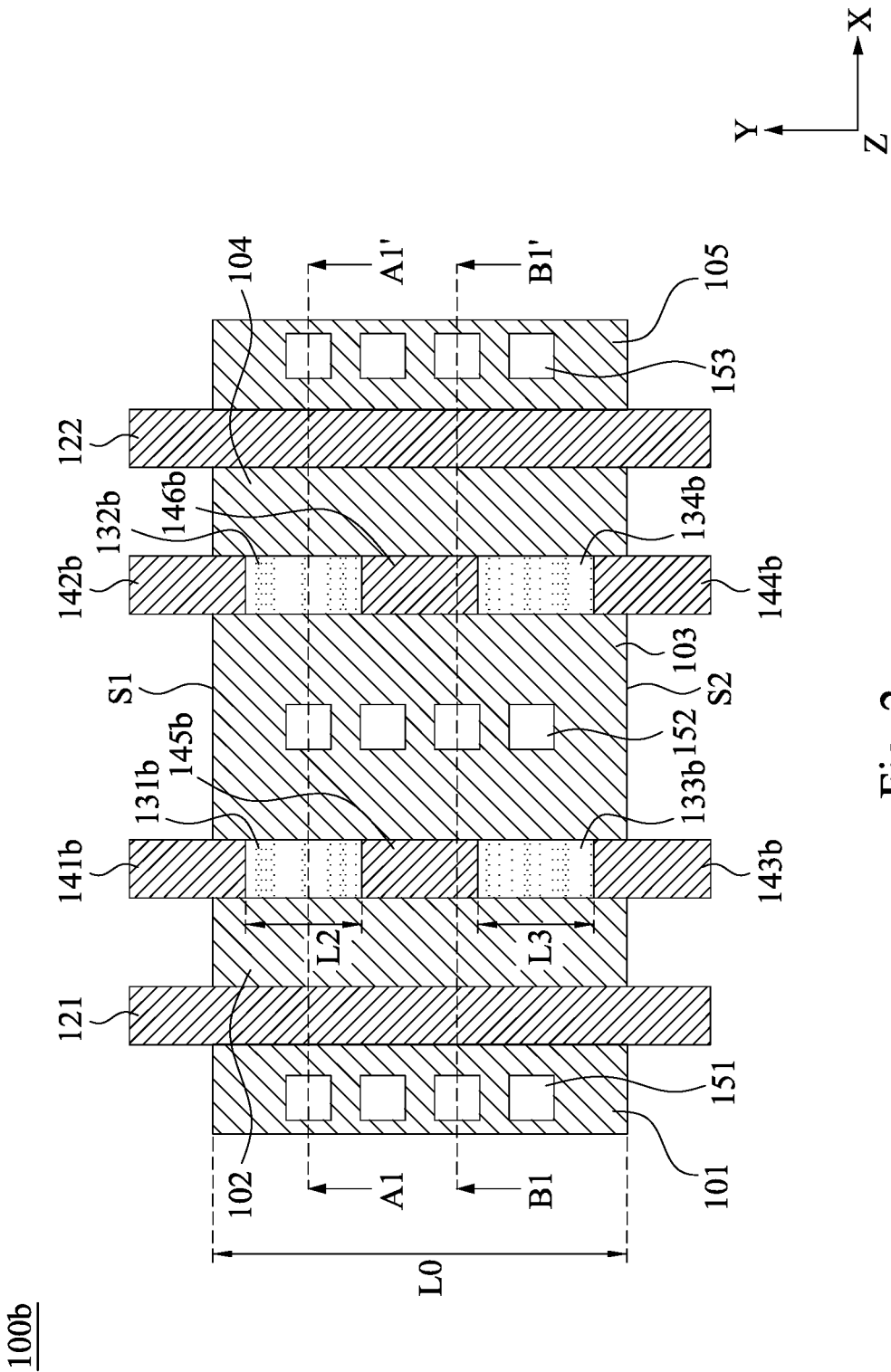
FIG. 2 is a schematic diagram illustrating another semiconductor device in accordance with some embodiments of the disclosure.

In some embodiments, as shown in FIG. 2, the semiconductor device 100b may include multiple isolation structures 131b~134b and the connected polysilicon structures 141b~146b. Specifically, the polysilicon structures 141b, 143b and 145b and the isolation structures 131b and 133b are staggered and connected and cross the two sides S1 and S2 of the active area structure 110. The polysilicon structure 141b is connected between one side S1 of the active area structure 110 and the isolation structure 131b. The polysilicon structure 145b is connected between the isolation structures 131b and 133b. The polysilicon structure 143b is connected between the isolation structure 133b and another side S2 of the active area structure 110.

In this way, since in the second direction, the total length (L2+L3) of the isolation structures 131b and 133b is smaller than the width L0 of the active area structure 110, therefore, in the first direction, part of the current can pass through the portions without the isolation structures 131*b* and 133*b* (i.e., portions under the polysilicon structures 141*b*, 143*b*, and 145*b*), so that the overall on-current can be increased. In addition, since in the second direction, the lengths and position distribution of the isolation structures 131*b*, 133*b*, and polysilicon structures 141*b*, 143*b*, and 145*b* are more even, the distribution of the on-current can be made more uniform.

Figure 3:
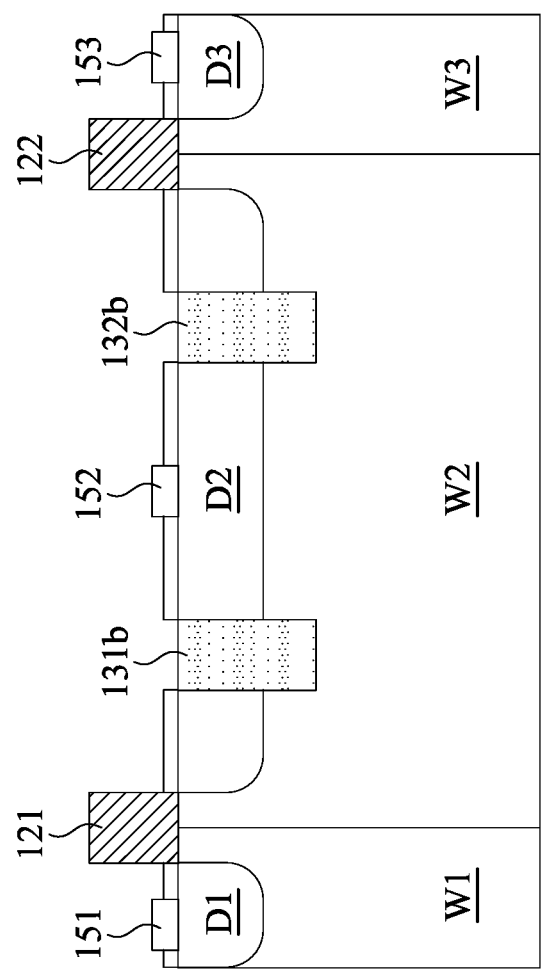
FIG. 3 and FIG. 4 are schematic diagrams illustrating cross-sectional views of a semiconductor device in accordance with embodiments of FIG. 2 of the disclosure.
Figure 4:
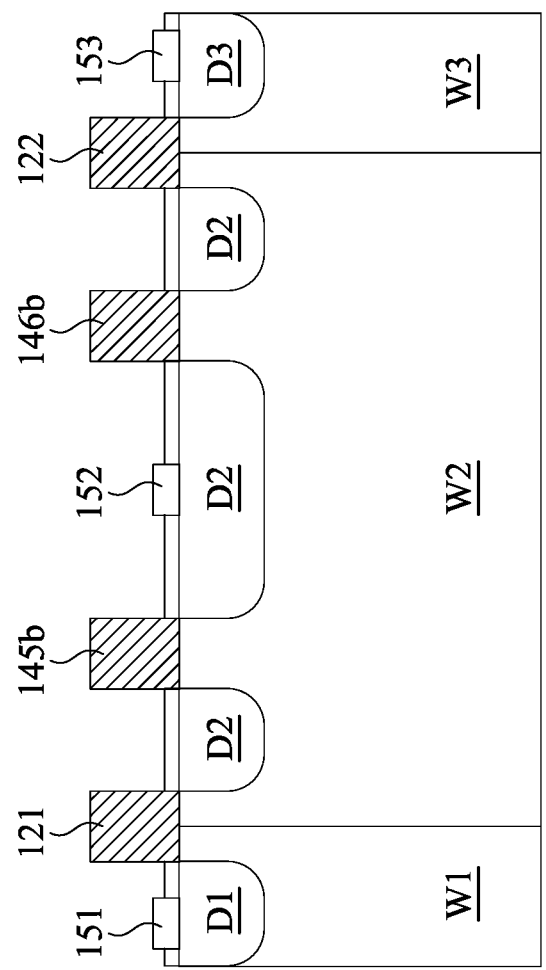

Furthermore, please refer to FIG. 3 and FIG. 4. FIG. 3 and FIG. 4 are schematic diagrams illustrating cross-sectional views of a semiconductor device along the lines A1-A1' and B1-B1' respectively in accordance with embodiments of FIG. 2 of the disclosure. As shown in FIG. 3, the active area structure 110 of the semiconductor device 100 includes a first well W1 of the first type, a second well W2 of the second type adjacent to the first well W1, a third well of the first type adjacent to the second well W2, a first doped area D1 of the second type located in the first well W1, a second doped area D2 of the second type located in the second well W2, and a third doped area D3 of the second type located in the third well W3. The gate 121 is formed above the first well W1 and the second well W2, and the gate 122 is formed above the second well W2 and the third well W3. The metal structure 151 is formed above the first doped area D1, and the metal structure 152 is formed above the second doped area D2, and the metal structure 153 is formed above the third doped area D3.

In addition, the isolation structures 131*b* and 132*b* of the semiconductor device 100 is located in the second well W2 of the active area structure 110. Specifically, isolation structures 131 and 132 are surrounded by the second doped area D2. In some embodiments, as shown in FIG. 3, depths of the isolation structures 131*b* and 132*b* are longer than the depth of the second doped area D2. The on-current has to pass through it under the isolation structures 131*b* and 132*b*. And as shown in FIG. 4, the polysilicon structures 145*b* and 146*b* of the semiconductor device 100 are located above the second well W2 of the active area structure 110. Because there is no isolation structure underneath the polysilicon structures 145*b* and 146*b*, the on-current can pass through it more easily.

Figure 5A:
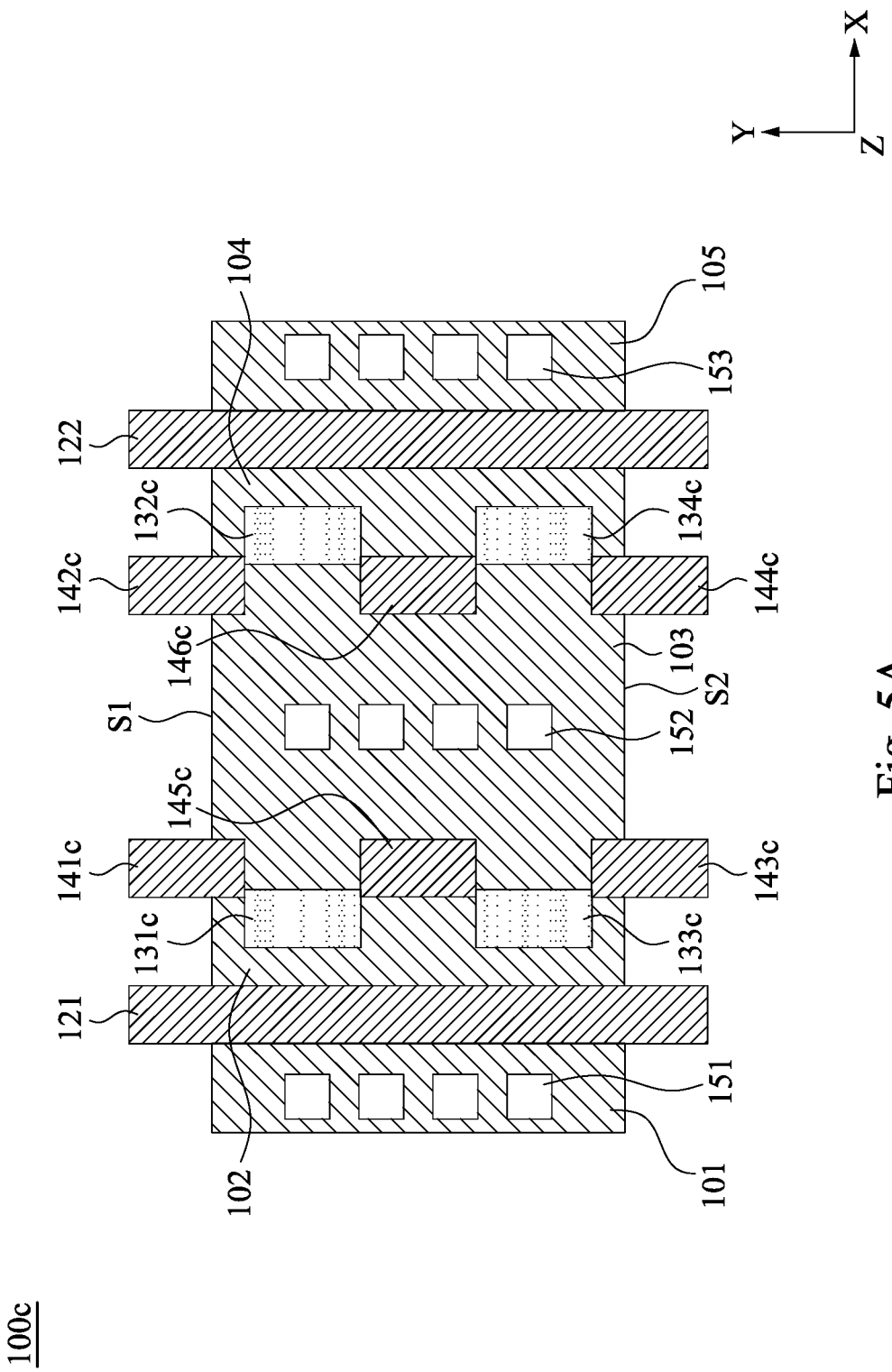
FIGS. 5A-5C are schematic diagrams illustrating another semiconductor device in accordance with some embodiments of the disclosure.

In addition, as shown in FIG. 3 and FIG. 4, since the area forming the isolation structure or the polysilicon structure has no silicide, therefore, by connecting the isolation structure and the polysilicon structure to each other in the second direction and crossing the two sides S1 and S2 of the active area structure 110, the large on-current can avoid to be concentrated along the surface with silicide. In other words, in some embodiments, the isolation structures and the polysilicon structures may not be aligned in the second direction. For example, compared to the isolating structures 131*b*, 133*b*, and polysilicon structures 141*b*, 143*b*, and 145*b* in the embodiment of FIG. 2 aligned in the second direction (that is, equidistant from gate 121 in the first direction), in the embodiment of FIG. 5A, the isolation structures 131*c* and 133*c* are set closer to the gate 121. In the first direction, the distances between the isolation structures 131*c*, 133*c*, the polysilicon structures 141*c*, 143*c*, 145*c* and the gate 121 respectively are different. However, the top sides of the isolation structures 131*c* and 133*c* are connected to the parts of the bottom sides of the polysilicon structures 141*c*, 143*c*, and 145*c* in the first direction respectively, and the silicide can still be divided into areas 102 and 103.

Figure 5B:
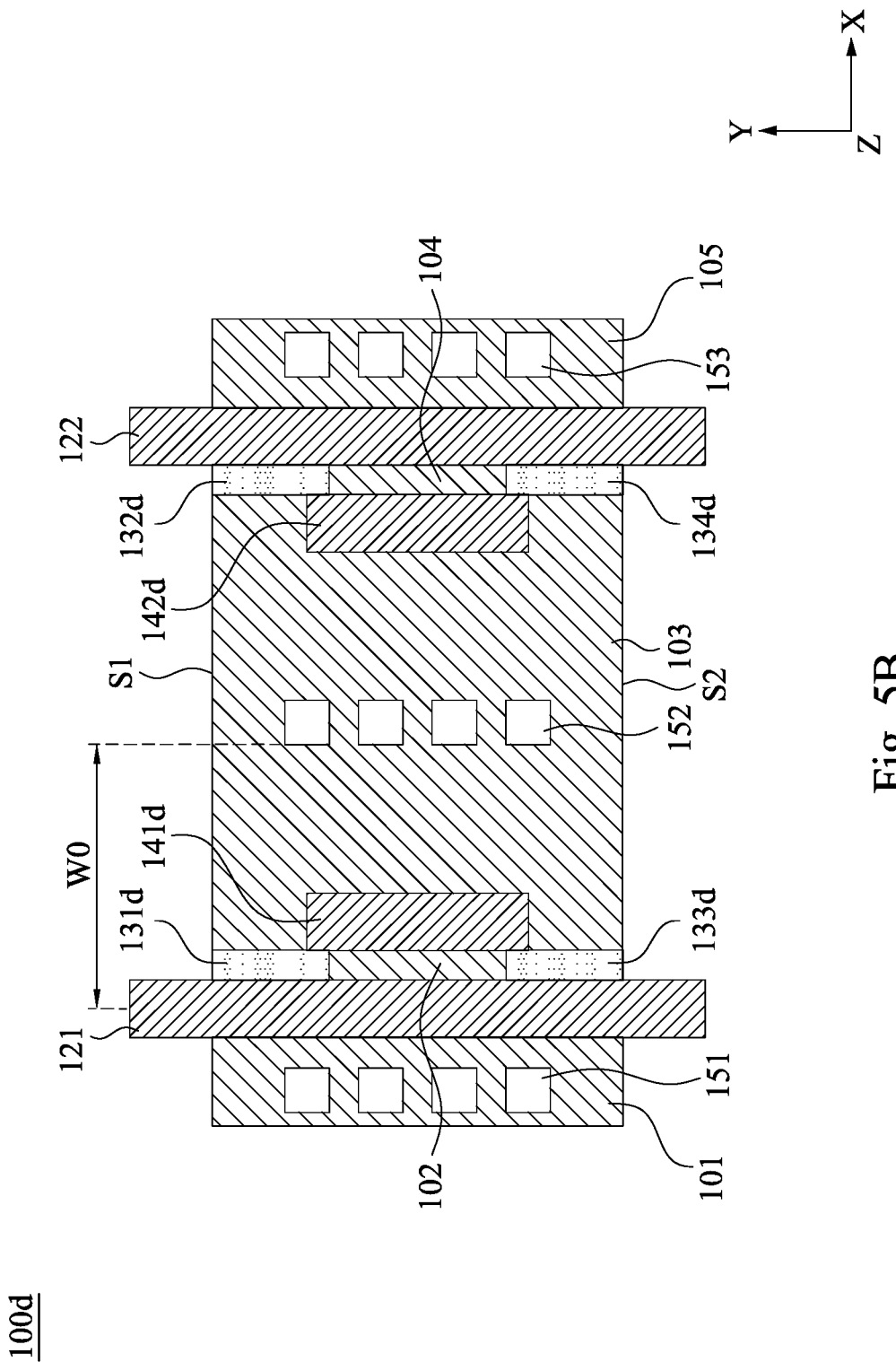

Furthermore, in some embodiments, the location of the isolation structure may be shown as the range W0, from below the gate 121 to the metal structure 152. The isolation structure is connected to the gate 121 but not connected to the metal structure 152. For example, as shown in FIG. 5B, part of the isolation structures 131*d* and 133*d* is located below the gate 121, and the right side of the top surface of the isolation structures 131*d* and 133*d* in the second direction is connected to the left side of the bottom surface of the polysilicon structure 141*d* in the second direction, so that the silicide is separated into areas 102 and 103.

Figure 5C:
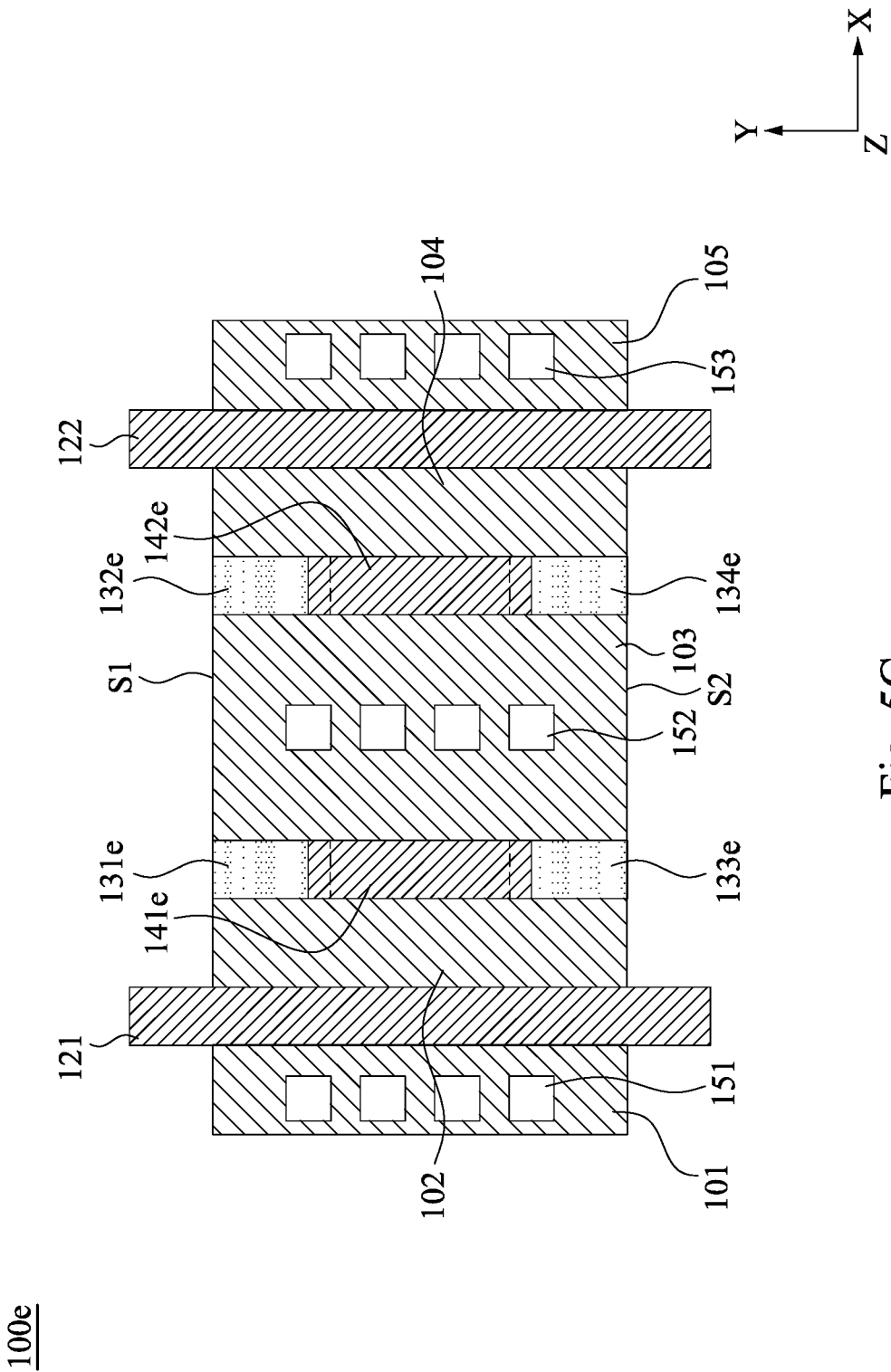

In addition, in some other embodiments, as shown in FIG. 5C, in the top view (Z-direction), part of the polysilicon structure 141*e* may be covered above the isolation structures 131*e* and 133*e*. In other words, part of the top surface of the isolation structures 131*e* and 133*e* is connected to part of the bottom surface of the polysilicon structure 141*e*, so that the silicide is separated into areas 102 and 103.

Figure 6:
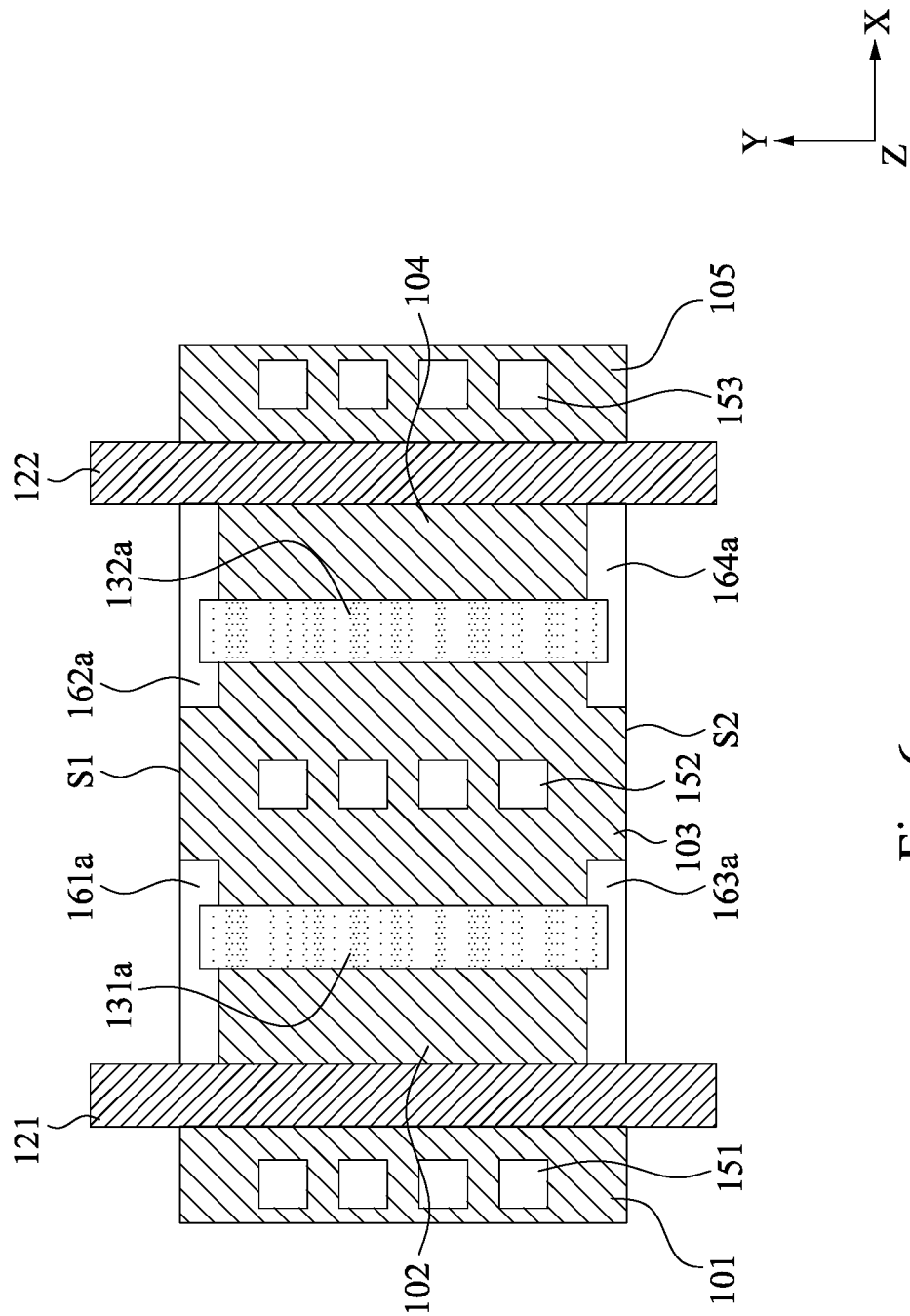
FIG. 6 is a schematic diagram illustrating another semiconductor device in accordance with some embodiments of the disclosure.

Except the polysilicon structure, in some embodiments, part of the area may also not be covered with silicide by using a mask, so as to avoid the situation where the current is attracted and concentrated by the silicide. Specifically, please refer to FIG. 6. FIG. 6 is a schematic diagram illustrating another semiconductor device 100*f* in accordance with some embodiments of the disclosure. In the embodiments of FIG. 6, the second active area 112 of the active area structure 110 of the semiconductor device 100 includes first areas (e.g., areas 102, 103 and 104) covered with silicide and second areas (e.g., areas 161*a*, 162*a*, 163*a* and 164*a*) not covered with silicide.

As shown in FIG. 6, second areas 161*a* and 163*a* not covered with silicide and the isolation structure 131*a* are connected to each other and cross the two sides S1 and S2 of the active area structure 110. Specifically, the second area 161*a* not covered with silicide is connected between one side S1 of the active area structure 110 and the isolation structure 131*a*. The second area 163*a* not covered with silicide is connected between the isolation structure 131*a* and another side S2 of the active area structure 110. In this way, in the first direction, part of the current can easily pass through the portions (i.e., areas 161*a* and 163*a*) without arranged the isolation structure, and because areas 161*a* and 163*a* are not covered with silicide, the on-current will not be too concentrated to damage the structure.

Figure 7:
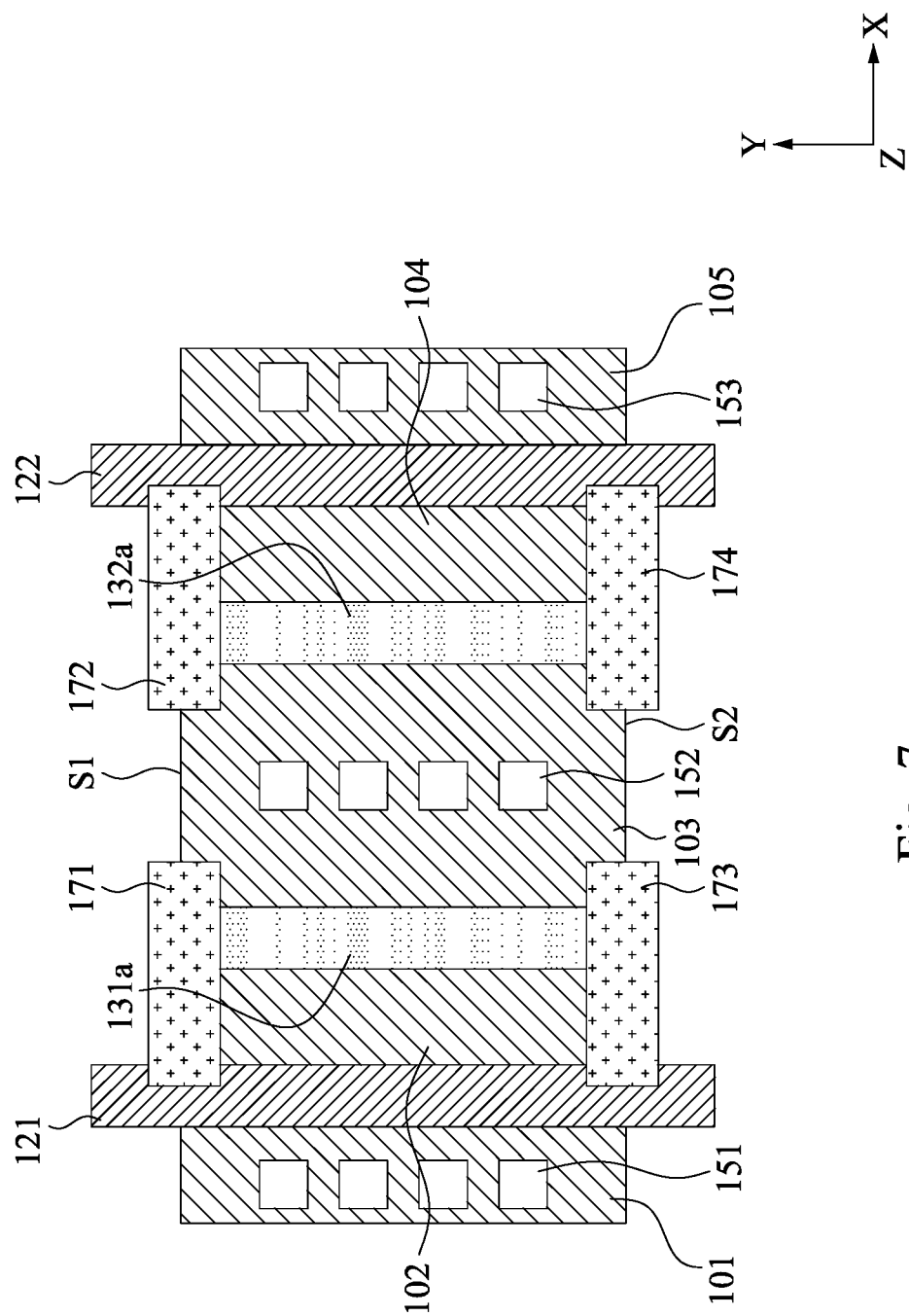
FIG. 7 is a schematic diagram illustrating a method for manufacturing the semiconductor device in accordance with embodiments of FIG. 6 of the disclosure.

Please refer to FIG. 7. FIG. 7 is a schematic diagram illustrating a method for manufacturing the semiconductor device 100*f* in accordance with embodiments of FIG. 6 of the disclosure. As shown in FIG. 7, when manufacturing semiconductor device 100*f*, placing masks (e.g., salicide block, SAB) 171, 172, 173, and 174 on top of the active area structure 110 will prevent the covered areas below from forming silicide, so as to generate the areas 161*a*~164*a* that are not covered with silicide, as shown in FIG. 6.

In some examples, the areas of the masks 171~174 are larger than the areas of the corresponding areas 161*a*~164*a*, respectively. Specifically, in a top view direction (Z-direction), the masks 171 and 173 cover part of the gate 121 and the isolation structure 131*a* to ensure that the areas 161*a* and 163*a* not covered with silicide are connected to the isolation structure 131*a* and are adjacent to the gate 121.

Figure 8:
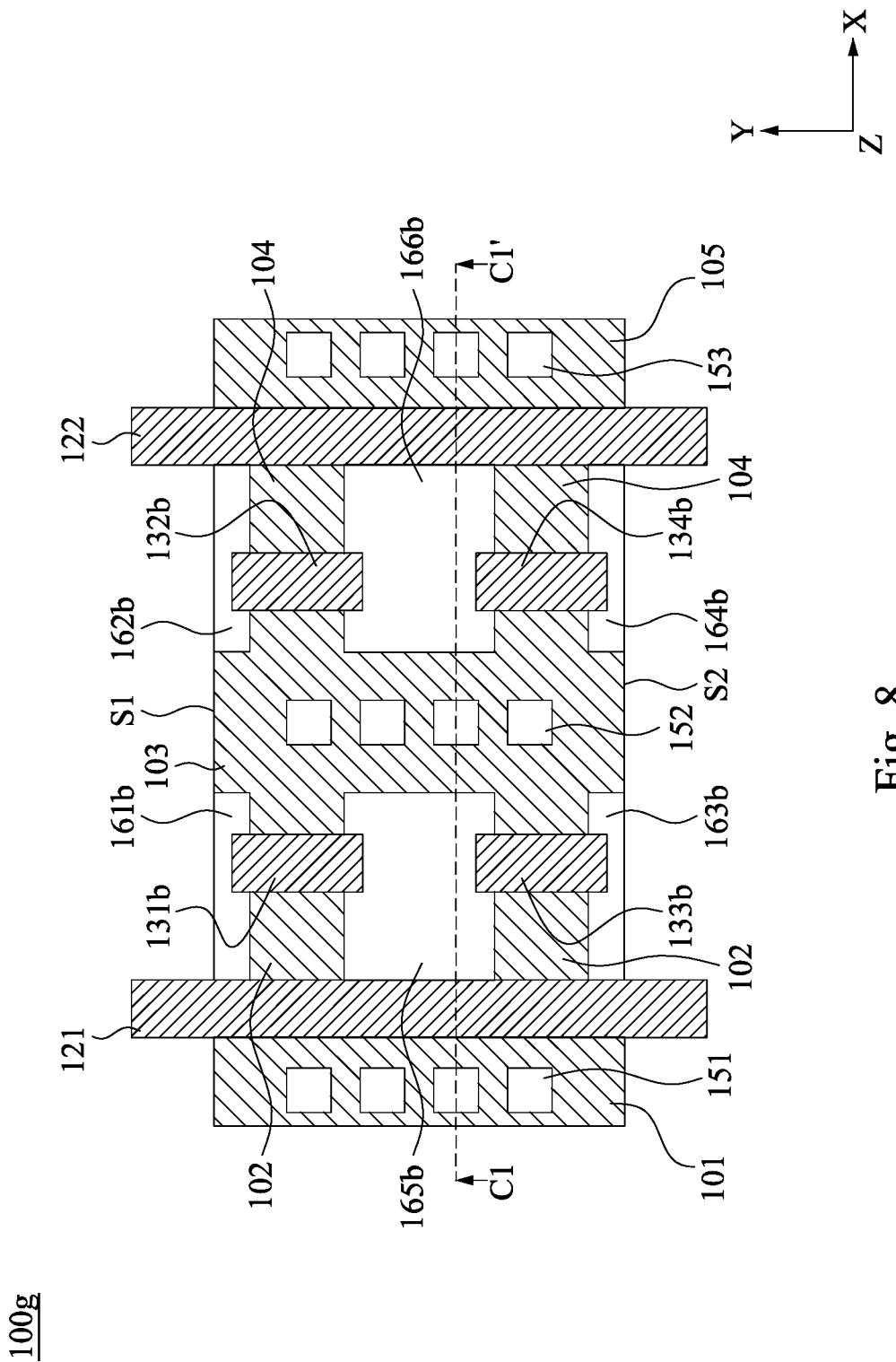
FIG. 8 is a schematic diagram illustrating another semiconductor device in accordance with some embodiments of the disclosure.

In addition, in other embodiments, as shown in FIG. 8, the semiconductor device 100*g* may include multiple isolation structures 131*b*~134*b* similar to those in FIG. 2 and include multiple areas 161*b*~166*b* that are not covered with silicide. Specifically, the area 161*b* not covered with silicide is connected to one side S1 of the active area structure 110, the isolation structure 131*b* and the gate 121, and the area 165*b* not covered with silicide is connected to the isolation structures 131*b*, 133*b* and the gate 121, and the area 163*b* not covered with silicide is connected to the gate 121, the isolation structure 133*b* and another side S2 of the active area structure 110.

Figure 9:
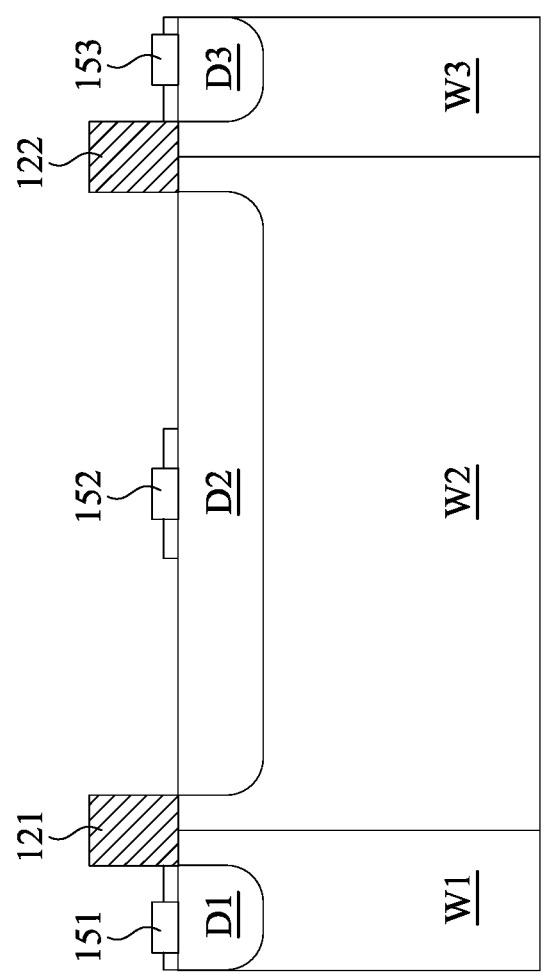
FIG. 9 is a schematic diagram illustrating cross-sectional views of a semiconductor device in accordance with embodiments of FIG. 8 of the disclosure.

Furthermore, please refer to FIG. 9. FIG. 9 is a schematic diagram illustrating cross-sectional views of a semiconductor device 100*g* along the line C1-C1' in accordance with embodiments of FIG. 8 of the disclosure. As shown in FIG. 9, on the surface of the second doped area D2 of the second well W2, adjacent to the gate 121 (that is, corresponding to the area 165*b* in FIG. 8) is not covered with silicide, and part of the silicide is adjacent to the metal structure 152 (that is, corresponding to the right side of the area 165*b* in FIG. 8).

In this way, in the first direction, part of the current can easily pass through the areas 161*b*, 163*b* and 165*b*, and because the silicide is not covered here, the on-current will not be too concentrated to damage the structure. In addition, because in the second direction, the lengths and position distribution of the isolation structures 131*b*, 133*b*, and areas 161*b*, 163*b*, and 165*b* are more even, the distribution of the on current can be made more uniform.

Figure 10:
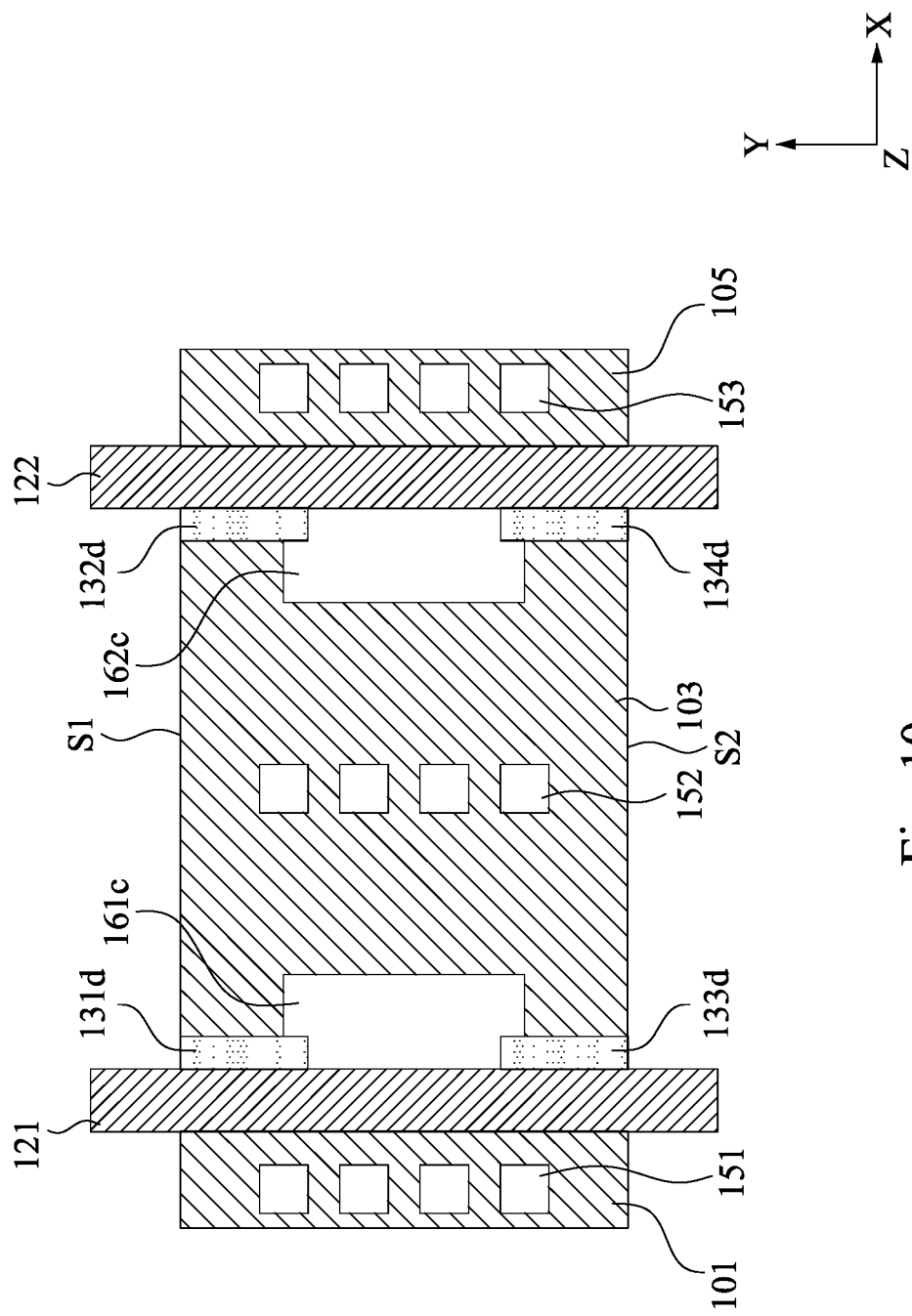
FIG. 10 is a schematic diagram illustrating another semiconductor device in accordance with some embodiments of the disclosure.

In some other embodiments, the area not covered with silicide may not be adjacent to the gate, but only be connected to the isolation structure and cross two sides S1 and S2 of the active area structure 110. Furthermore, in some embodiments, as shown in FIG. 10, similar to the embodiment of FIG. 5B, part of the isolation structures 131*d*~134*d* may be located under the gate 121. The surface of the area 161*c* between the isolation structures 131*d* and 133*d* is not covered with silicide.

Figure 11:
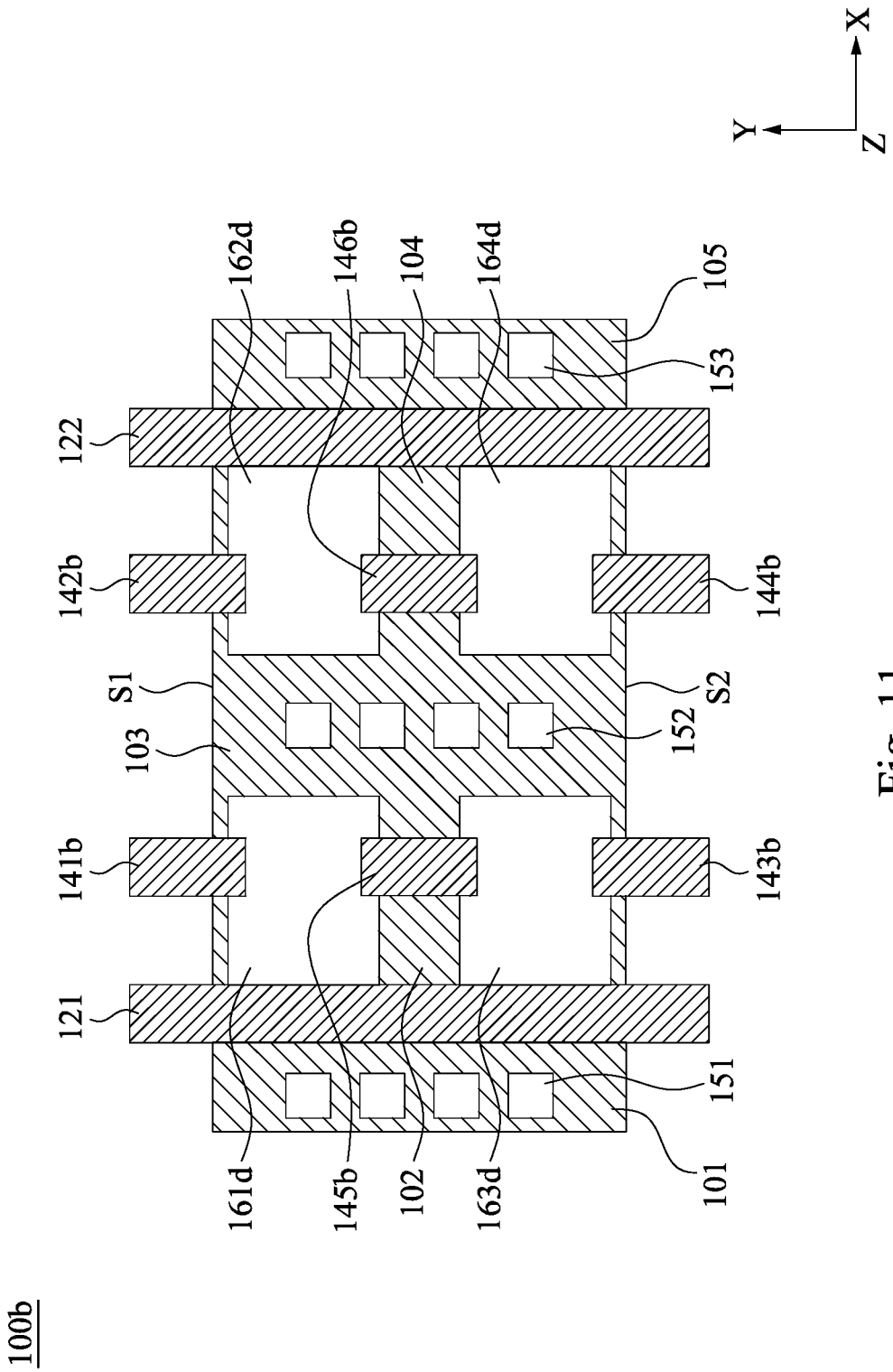
FIG. 11 is a schematic diagram illustrating another semiconductor device in accordance with some embodiments of the disclosure.

Please refer to FIG. 11. FIG. 11 is a schematic diagram illustrating another semiconductor device 100*i* in accordance with some embodiments of the disclosure. In some embodiments, as shown in FIG. 11, the semiconductor device 100*i* includes polysilicon structures 141*b*~146*b* and areas 161*d*~164*d* not covered with silicide. Specifically, the polysilicon structures 141*b*, 143*b*, and 145*b* and areas 161*d* and 163*d* not covered with silicide are staggered and connected to each other and cross two sides S1 and S2 of the active area structure 110. The polysilicon structure 141*b* is connected to one side S1 of active area structure 110 and the area 161*d* not covered with silicide. The polysilicon structure 145*b* is connected to the areas 161*d* and 163*d* which are not covered with silicide. The polysilicon structure 143*b* is connected to the area 163*d* not covered with silicide and another side S2 of the active area structure 110.

Since there is no isolation structure in the embodiment of FIG. 11, the on-current is large. In addition, the areas 102 and 103 are divided by the interconnection of the polysilicon structure and the area not covered with silicide, so that the on-current is uniform to avoid concentration and damage to the structure.

In summary, by adjusting the ratio between the total length of the isolation structure and the width of the active area structure in the second direction, it is able to control the magnitude of the on-current without excessively affecting the withstand voltage. The shorter the total length of the isolation structure, the larger the on-current. In addition, it should be noted that the polysilicon structure and the area not covered with silicide can also be mixed used or used in combination. Those of ordinary skills in the art may refer to the above content to design based on actual needs, and will not be repeated here.

Although specific embodiments of the disclosure have been disclosed with reference to the above embodiments, these embodiments are not intended to limit the disclosure. Various alterations and modifications may be performed on the disclosure by those of ordinary skills in the art without departing from the principle and spirit of the disclosure. Thus, the protective scope of the disclosure shall be defined by the appended claims.

What is claimed is:

1. A semiconductor device, comprising:
   an active area structure, arranged along a first direction;
   at least one gate, arranged above the active area structure and along a second direction different from the first direction;
   at least one isolation structure, arranged in the active area structure, wherein a length of the at least one isolation structure is shorter than a width of the active area structure in the second direction; and
   at least one polysilicon structure, arranged above the active area structure in a third direction, wherein the at least one polysilicon structure and the at least one isolation structure are staggered in the second direction, wherein the at least one gate and the at least one polysilicon structure are arranged along the first direction, and the first direction, the second direction and the third direction are perpendicular to each other.

2. The semiconductor device of claim 1, further comprising:
   at least one first metal structure, arranged above the active area structure, as a source of a transistor; and
   at least one second metal structure, arranged above the active area structure, as a drain of the transistor,
   wherein the at least one gate and the at least one isolation structure are located between the at least one first metal structure and the at least one second metal structure.

3. The semiconductor device of claim 1, wherein part of the at least one isolation structure is located under the at least one gate.

4. The semiconductor device of claim 1,
   wherein the at least one polysilicon structure and the at least one isolation structure are connected to each other and cross two sides of the active area structure parallel to the first direction.

5. The semiconductor device of claim 4, wherein a bottom surface of the at least one polysilicon structure or one side of the bottom surface of the at least one polysilicon structure is connected to a top surface of the at least one isolation structure or one side of the top surface of the at least one isolation structure.

6. The semiconductor device of claim 4, wherein the at least one isolation structure and the at least one polysilicon structure are not aligned with each other in the second direction.

7. The semiconductor device of claim 1, wherein the active area structure comprises a first area covered by silicide and at least one second area not covered by silicide, wherein the at least one second area and the at least one isolation structure are connected to each other and cross two sides of the active area structure parallel to the first direction.

8. The semiconductor device of claim 7, wherein at least one side of the at least one second area is connected to at least one side of a top surface of the at least one isolation structure.

9. The semiconductor device of claim 7, wherein the at least one isolation structure and the at least one second area are not aligned with each other in the second direction.

10. The semiconductor device of claim 7, wherein the at least one second area is adjacent to the at least one gate.

11. The semiconductor device of claim 1, wherein the active area structure comprises a first area covered by silicide and at least one second area not covered by silicide, wherein the at least one second area, the at least one polysilicon structure and the at least one isolation structure are connected to each other and cross two sides of the active area structure parallel to the first direction.

12. The semiconductor device of claim 11, wherein the at least one isolation structure, and the at least one polysilicon structure and the at least one second area are not aligned with each other in the second direction.

13. The semiconductor device of claim 1, wherein the at least one isolation structure comprises:
   a plurality of isolation structures not connected to each other.

14. The semiconductor device of claim 13, wherein
   the at least one polysilicon structure and the isolation structures are staggered and connected to each other and cross two sides of the active area structure parallel to the first direction.

15. The semiconductor device of claim 13, wherein the active area structure comprises a first area covered by silicide and at least one second area not covered by silicide, wherein the at least one second area and the isolation structures are staggered and connected to each other and cross two sides of the active area structure parallel to the first direction.

16. The semiconductor device of claim 13, wherein the active area structure comprises a first area covered by silicide and at least one second area not covered by silicide, wherein the at least one second area, the at least one polysilicon structure and the isolation structures are staggered and connected to each other and cross two sides of the active area structure parallel to the first direction.

17. The semiconductor device of claim 1, wherein the active area structure comprises:
   a first well of a first type;
   a second well of a second type, adjacent to the first well;
   a first doped area of the second type, located in the first well; and
   a second doped area of the second type, located in the second well,
   wherein the at least one gate is located above the first well and the second well, the at least one isolation structure is located in the second well, and a surface of the second doped area is not completely covered with silicide.

18. The semiconductor device of claim 17, wherein the surface of the second doped area not covered by silicide and the at least one isolation structure are connected to each other and cross two sides of the active area structure parallel to the first direction.

19. The semiconductor device of claim 17, wherein:
   the at least one polysilicon structure is arranged above the second well, wherein the at least one polysilicon structure and the at least one isolation structure are connected to each other and cross two sides of the active area structure parallel to the first direction.

20. A semiconductor device, comprising:
   an active area structure, arranged along a first direction;
   at least one gate, arranged above the active area structure and along a second direction different from the first direction;
   at least one first metal structure, arranged above the active area structure as a source of a transistor;
   at least one second metal structure, arranged above the active area structure as a drain of the transistor; and
   at least one polysilicon structure, arranged above the active area structure,
   wherein the active area structure comprises a first area covered by silicide and at least one second area not covered by silicide, wherein the at least one second area and the at least one polysilicon structure are connected to each other and cross two sides of the active area structure parallel to the first direction,
   wherein the at least one second area and the at least one polysilicon structure are staggered in the second direction, wherein the at least one gate, the at least one first metal structure, the at least one second metal structure and the at least one polysilicon structure are arranged along the first direction, and the first direction, the second direction and a third direction vertical to the first area and the second area are perpendicular to each other.

* * * * *